US006386315B1

(12) United States Patent
Roy et al.

(10) Patent No.: US 6,386,315 B1
(45) Date of Patent: May 14, 2002

(54) FLAT PANEL SOUND RADIATOR AND ASSEMBLY SYSTEM

(75) Inventors: Kenneth P. Roy, Holtwood; Richard S. Hendricks; Wesley T. K. Bischel, both of Lancaster, all of PA (US)

(73) Assignee: AWI Licensing Company, Wilmington, DE (US)

(*) Notice: Subject to any disclaimer, the term of this patent is extended or adjusted under 35 U.S.C. 154(b) by 18 days.

(21) Appl. No.: 09/627,706

(22) Filed: Jul. 28, 2000

(51) Int. Cl.$^{7}$ .................................................. H05K 5/00
(52) U.S. Cl. ......................... 181/150; 181/30; 181/173; 381/152; 381/431
(58) Field of Search ................................ 181/150, 166, 181/171, 30, 172, 173; 381/386, 152, 391, 392, 398, 431, 205, 423, 399; 52/506.07, 507, 511

(56) References Cited

U.S. PATENT DOCUMENTS

| | | | | |
|---|---|---|---|---|
| 4,003,449 A | * 1/1977 | Bertagni | 181/173 |
| 4,228,327 A | * 10/1980 | Sawafuji | 381/398 |
| 4,273,968 A | * 6/1981 | Suyama | 381/431 |
| 4,330,691 A | 5/1982 | Gordon | 179/146 |
| 4,923,032 A | 5/1990 | Nuernberger | 181/150 |
| 4,928,312 A | 5/1990 | Hill | 381/192 |
| 4,997,058 A | * 3/1991 | Bertagni | 181/166 |
| 5,088,574 A | 2/1992 | Kertesz | 181/150 |
| 6,164,408 A | 12/2000 | Lamm et al. | 181/30 |
| 6,201,878 B1 | * 3/2001 | Azima et al. | 181/171 |
| 6,278,787 B1 | * 8/2001 | Azima | 381/152 |
| 2001/0026625 A1 | * 10/2001 | Azima et al. | 381/152 |
| 2001/0038701 A1 | * 11/2001 | Corynen | 381/152 |

FOREIGN PATENT DOCUMENTS

| | | | |
|---|---|---|---|
| JP | 55082597 A | * 6/1980 | H04R/7/22 |
| JP | 57203400 A | * 12/1982 | H04R/23/00 |

* cited by examiner

*Primary Examiner*—Robert E. Nappi
*Assistant Examiner*—Edgardo San Martin
(74) *Attorney, Agent, or Firm*—Womble Carlyle Sandridge & Rice, PLLC

(57) ABSTRACT

An apparatus for mounting a flat panel radiator into a ceiling grid. The ceiling grid system includes openings defined by main beams and crossbeams. The main beams are secured through hanger wires to a hard ceiling. The main beams and the crossbeams have flanges with the crossbeams resting on the flanges of the main beams. The mounting apparatus has a frame including a top plate, a side plate, and a bottom plate, containment elements and isolation elements attached to the frame, and an acoustically transparent scrim attached to the bottom of the frame. The flat panel radiator is mounted between containment elements and isolation elements. The radiator panel can be fabricated from a honeycomb core. The containment elements may be made from a stiff to resilient material, whereas the isolation element will always be resilient to vibration isolate the radiator panel from the ceiling grid system both mechanically and acoustically. The flat panel sound radiator assembly can also be installed in wall partitions.

31 Claims, 10 Drawing Sheets

FLAT PANEL SOUND RADIATOR AND ASSEMBLY SYSTEM

CROSS-REFERENCE TO RELATED APPLICATIONS

This patent application is related to, and contains common disclosure with, co-pending and commonly assigned patent applications “Flat Panel Sound Radiator with Special Edge Details” Ser. No. (09/641,071), and “Flat Panel Radiator with Sound Absorbing Scrim”, Ser. No. (09/705,313). The present invention is also related to co-pending and common assigned patent application “Ceiling Panel”, Ser. No. 09/141,407 filed Aug. 12, 1998. The co-pending patent applications are hereby incorporated by reference into this description as fully as if here represented in full.

BACKGROUND OF THE INVENTION

This invention relates primarily to electronic sound masking systems in a workplace environment, but may additionally involve any combination of signals including masking, aural enhancement, paging, public address, and background music. More specifically, it relates to sound masking systems adapted for use with a suspended ceiling.

Noise in a workplace is not a new problem, but it is one that is receiving increasing attention as open workplace configurations and business models continue to evolve. A number of recent studies indicate that noise, in the form of conversational distraction, is the single largest negative factor impacting worker productivity.

As the service sector of the economy grows, more and more workers find themselves in offices rather than manufacturing facilities. The need for flexible, reconfigurable space has resulted in open plan workspaces, i.e., large rooms with reduced height, moveable partitions over which sound can pass. The density of workstations is also increasing, with more workers occupying a given physical space. More workers are using speakerphones, conferencing technologies, and multimedia computers with large, sound reflecting screens and even voice input. All these factors tend to increase the noise level in workplaces making the noise problem more difficult and costly for businesses to ignore.

In closed spaces, particularly in office and meeting room settings, speech intelligibility and acoustic performance are determined by a variety of factors, including room shape, furnishings, number of occupants, and especially floor, wall, and ceiling treatments. This acoustic environment will determine how much sound intrusion will occur as well as the level to which the listeners within these spaces will be affected by extraneous noise and conversational distraction.

A more general examination of the interior environment of a room reveals other aspects that play a major role in how sound is perceived by the occupants. Recent research has indicated that when looking at the issue of sound intrusion between spaces, the transmission loss of materials and sound absorption characteristics of materials are not the only contributors to the perceived acoustical environment. Another factor is the background noise in a space. This includes the sounds produced by overhead utilities such as heating, ventilation, and air conditioning (HVAC) ductwork. Another significant factor is the sound, much of which is conversational, that intrudes from adjacent spaces. This has become the focus of much current research. Sound can enter a space in a variety of ways. In an office setting, sound travels through walls or partitions; through open air spaces such as doorways and hallways; and through other air spaces such as HVAC ductwork, registers and diffusers. Sound intrusions may take a number of paths including 1) travel by deflection over partitions that end below the ceiling; 2) through ceiling panels, across the utility/plenum space, and back down through the ceiling; 3) through the structural ceiling deck, the utility/plenum space, and the suspended ceiling, from above; and 4) conversely through the ceiling, utility/plenum space, and ceiling deck/floor from below.

There are two approaches to mitigating the presence of undesired sounds in a space. Sound can be attenuated as it travels from the source, or it can be covered up with some sort of masking technique. It is the latter of these approaches that is the focus of this invention.

Conversational distraction and uncontrolled noise are the primary causes of productivity loss within office workspaces. The principle of sound masking involves the introduction of sound in a specified frequency range. The addition of sound at an appropriate level in the frequency spectrum occupied by the human voice provides a masking effect, in essence, drowning out the undesired sounds in such a way that it is not noticeable to the listener. A typical sound masking system includes the following elements:

1. a “pink noise” signal;
2. a means of filtering the signal to provide the desired spectrum of sound;
3. a means of amplification; and
4. a means of creating a uniform sound field in the area being treated.

A pink noise signal contains equal amounts of sound energy in each one-third octave band, and covers a broad frequency range which includes the speech spectrum.

Sound masking is usually accomplished by the introduction of a precisely contoured broadband sound that is constant in level over time, and sufficiently loud to mask conversational distraction and unwanted noise, but not so loud as to be annoying in and of itself. This sound is similar to that which we attribute to the HVAC system air diffuser. The system generally consists of electronic devices which generate a sound signal, shape or equalize a signal and amplify a signal. This signal is then distributed to an array of speakers that are normally positioned above the ceiling in the plenum on 12–16 foot centers. Sound masking systems in open plan offices are typically set at a sound level which corresponds to 48 dBA (dB “A” weighted) +/−2 dB. This sound level generally insures conversational privacy without causing a distraction itself.

Typical electrodynamic cone loudspeakers have an acoustic radiation pattern that is very dependent upon the frequency of excitation. At low frequencies, these loudspeakers radiate sound fairly uniformly over a broad range of angles. As the frequency of the input wave increases, the sound radiation pattern produced by the loudspeaker becomes more focused and directed on-axis (like a flashlight as opposed to a floodlight). A common 6.5-inch speaker, for example, may have a forward radiation pattern approaching an omni-directional 180 degrees at 250 Hz, but when driven at 4 kHz, the majority of the forward sound energy produced is concentrated in a highly directional beam that is about 15 degrees wide.

Since conventional dynamic loudspeakers produce a directed, coherent sound field at the frequencies of interest in masking, their utilization to create a uniform, diffuse reverberant field presents a challenge.

One solution that has often been employed utilizes traditional dynamic loudspeakers mounted above a ceiling. An array of conventional dynamic loudspeakers is mounted above a suspended ceiling and driven by conventional electrical wiring. The loudspeakers are oriented to fire upwards into the hard floor slab above. This provides a longer reflective path for the sound to travel thus more evenly dispersing the sound in the plenum space. The reflected sound passes through the suspended ceiling system, where it may be further dispersed. The penalty for firing the speakers upwards, however, is that considerable additional power is required to drive the speakers to realize the desired sound levels to the listener. Pointing the loudspeakers directly down through the ceiling, or mounting conventional speakers on top of the ceiling panels, would create a non-uniform sound field at the audible frequencies of interest, with some areas sounding louder and other areas sounding softer. Compensating for this non-uniform sound field would require the use of many more speakers at considerably higher cost. What is needed is a better way to deliver sound to the desired space, and to do so in such a way with a system that is easily installed and simple to configure and change.

SUMMARY OF THE INVENTION

The present invention provides a system for mounting a flat panel sound radiator system in a standard ceiling grid system to generate the desired sound field into an architectural space immediately below. The flat panel radiator includes a stiff radiating panel, a transducer having a magnet attached to the radiating panel, a voice coil assembly attached to the radiating panel, and wiring connected to an excitation source.

Flat panel radiators (speakers) work on the principle that an exciter hooked up to the flat panels causes the panels to vibrate, generating sound. The sound that is generated by flat paneled radiators is not restricted to the cone of sound (beaming) that normal speakers generate. The vibration of the panel generates a complex random ripple of waveforms on the panel surface, which in an ideal model radiates sound in a circular pattern (omni-directional) from the panel. This differs from a standard cone speaker which can be considered as a piston, producing a beam of sound, which, in the field of stereo sound systems results in the phenomenon called the "sweet spot" where the two beams interact most effectively for stereo sound. The omni-directional radiation pattern of the flat panel radiators means that the sound levels are equal across a large listening area.

Flat panel radiators have broad acoustic radiation patterns at the frequencies required for sound masking. As noted, the flat panel radiator includes a light, stiff radiating panel of arbitrary size, and a transducer. The transducer has a magnet clamped to the radiating panel, a voice coil assembly, also attached to the panel, and wiring connected to an excitation source. When electrical current is passed through the voice coil, the resulting combination of electromagnetic field forces with the magnetic field will induce a very small relative displacement, or bending, of the panel material at the mounting points. Rather than the coherent piston-like motion of a cone speaker, the motion of the flat panel is decidedly incoherent, containing many different complex modes spread over the entire surface of the radiator. This effect contributes significantly to the broad radiation pattern and lack of beaming behavior characteristic of this technology. This can best be achieved through a flat panel made of honeycomb cell-type material, which is lightweight and does not rust. This honeycomb material provides minimal loss and a smooth sound pressure response in the low, middle, and high frequency ranges.

The core material is typically "sandwiched" between skins of high strength composite material. A bonding adhesive is used to attach the skin material to the honeycomb core. The resultant honeycomb panel offers one of the highest strength-to-weight constructions available.

In the novel mounting configuration described herein, a rectangular radiating panel of a flat panel radiator is supported by containment elements and placed inside a frame element. An additional isolation element may be attached to isolate the radiator panel vibrations from the normal contacts to the ceiling grid support structure. This mounting configuration improves the isolation between a vibrating element of the flat panel speaker and the support grid structure. A bridge support element is attached to the frame element in this configuration, and contains the wiring for the flat panel speaker thus avoiding contact with the radiating panel. An acoustic scrim is attached to the frame for aesthetic purposes.

DESCRIPTION OF THE DRAWINGS

The invention is better understood by reading the following detailed description of the invention in conjunction with the accompanying drawings, wherein.

DETAILED DESCRIPTION OF THE INVENTION

Figure 1:
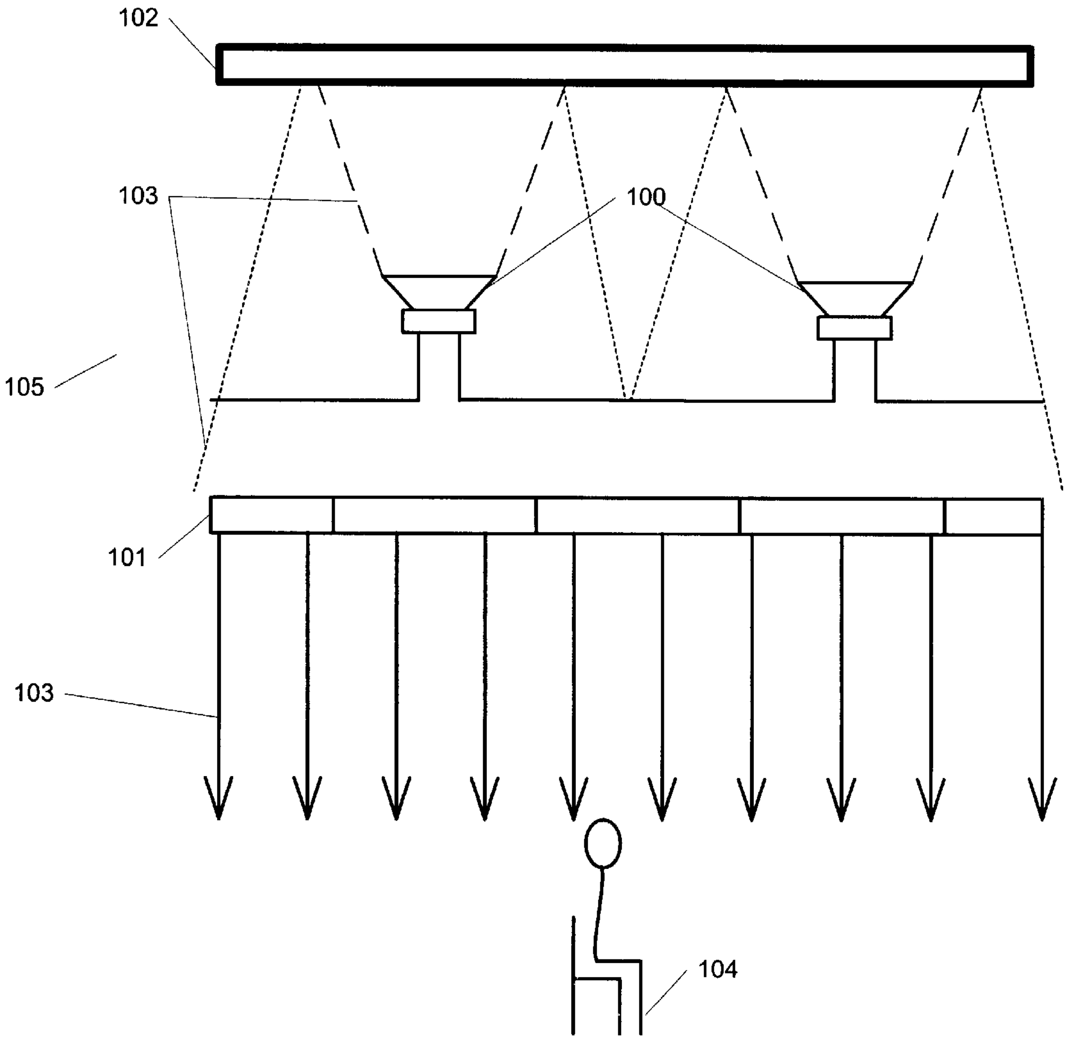
FIG. 1 illustrates a prior art sound system arranged to create a uniform, diffused, reverberant sound field.

Referring now in more detail to the drawings in which like numerals refer to like parts throughout the several views, FIG. 1 illustrates a prior art sound system arranged to produce a modified pink noise signal to mask undesirable noises. This signal is often referred to as "white noise" although it is technically not, but it is characterized as a broadband uniform field of masking sound. The speaker arrangement in the prior art utilizes traditional dynamic loudspeakers mounted above a ceiling, on 12–16 foot centers, as shown in the diagram of FIG. 1. An array of conventional dynamic loudspeakers 100 is mounted above a suspended ceiling 101, powered through conventional electrical wiring 105. The loudspeakers are oriented to fire upwards into the hard slab above 102. This arrangement provides a longer path for the sound to travel, and further disperses the sound field 103, depending upon the surface treatment of the hard slab above. The reflected sound passes through the suspended ceiling system 101, where it may be further dispersed, so that the sound field 103 at the listener

104 is relatively diffused and uniform, as indicated by the arrows. Pointing the loudspeakers directly down through the ceiling, or mounting conventional speakers on top of the ceiling panels, would create a non-uniform sound field at the frequencies of interest, with some areas sounding louder and some sounding softer. Compensating for the non-uniform sound field requires the use of many more speakers at considerably higher cost. The penalty for firing the speakers upwards, however, is that considerable additional power is required to drive the speakers 100 to realize the desired sound levels to the listener 104.

Figure 2:
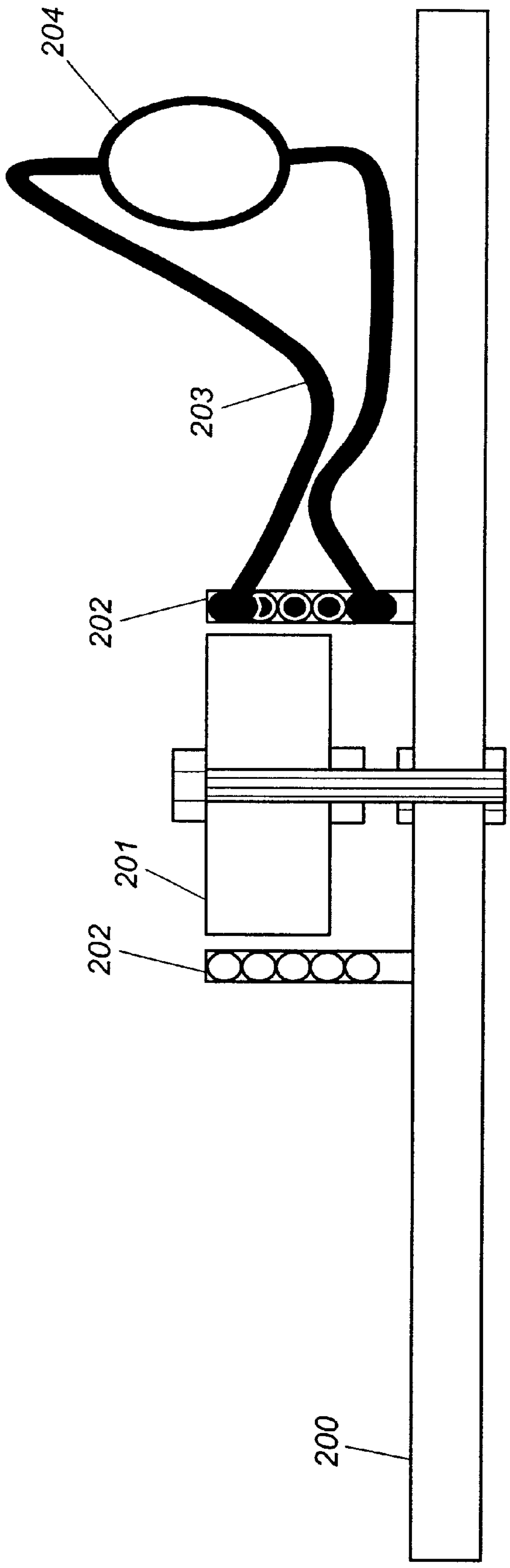
FIG. 2 illustrates a cross-section of a flat panel radiator that can be utilized in the present invention.

An alternative approach to generating acoustic frequencies for sound masking has been the development of flat panel radiator technology. Historical attempts to make high quality flat panel radiators have focused on duplicating the behavior of cone speakers. These efforts have not met with much success until fairly recently. Flat panel radiators are now available that have broad acoustic radiation patterns at the frequencies required for sound masking in an open workplace environment. The flat panel radiator, shown in FIG. 2, includes a light, stiff radiating panel 200 of arbitrary size, and a transducer. The transducer contains a magnet 201 that is clamped to the radiating panel 200, a voice coil assembly 202, also attached to the radiating panel 200, and electrical wiring 203 connected to an excitation source 204 that is not part of the radiator system. There are at least two embodiments of the transducer that can be used in flat panel products. FIG. 2 shows the "bender" or "clamped" driver. When electrical current is passed through the voice coil 202, the electromagnetic field generated by the coil and the magnetic field from the magnet 201 interact, thus inducing a very small relative displacement, or bending, of the panel material 200 between the voice coil 202 and magnet 201 mounting points. Rather than the coherent piston-like motion of a cone speaker, the motion of the flat panel 200 is decidedly incoherent, containing many different complex modes spread over the entire surface of the radiator 200. This effect contributes significantly to the broad radiation pattern and lack of beaming behavior characteristic of this technology.

Figure 3:
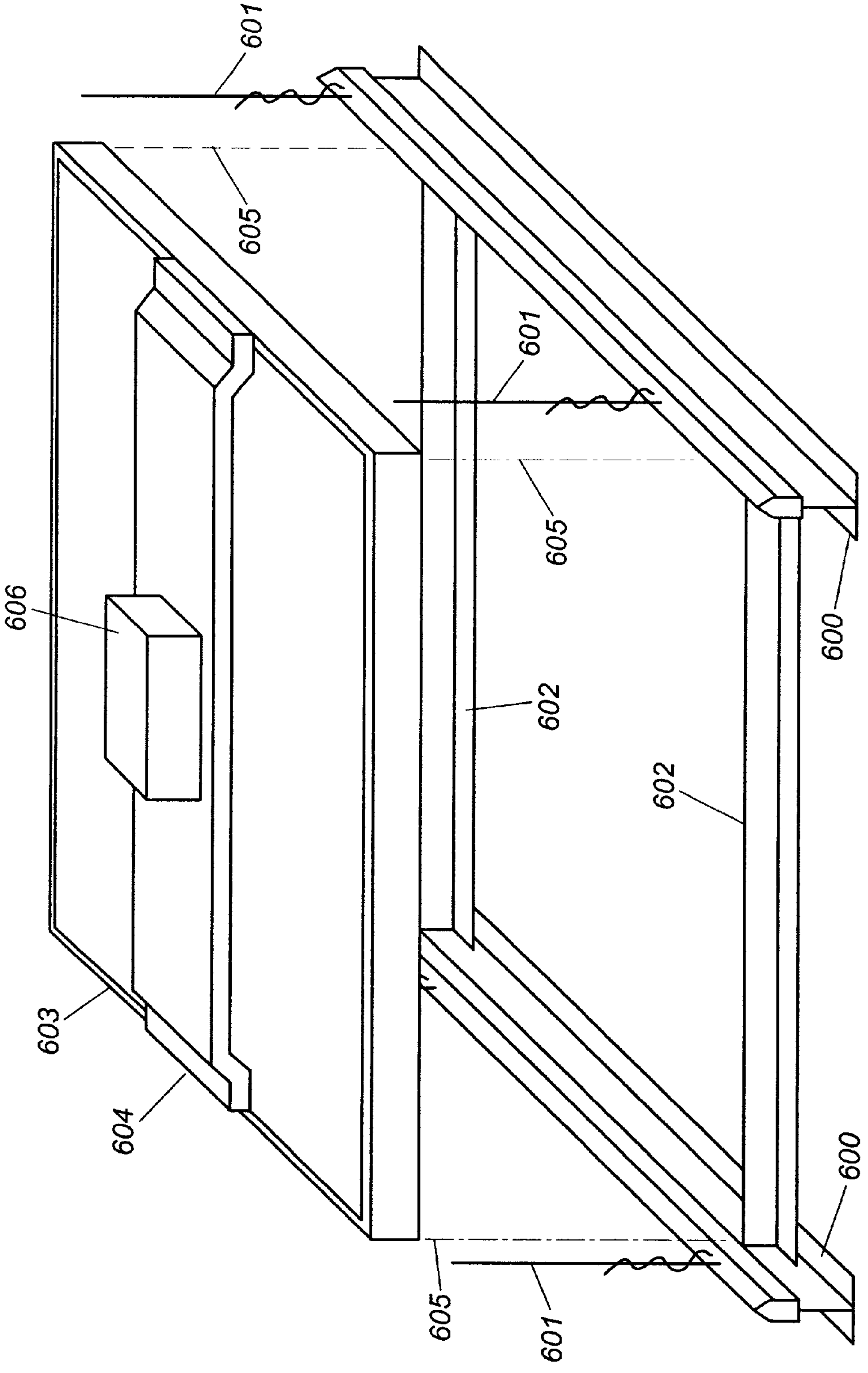
FIG. 3 illustrates the mounting of a flat panel radiator in a standard inverted "T" ceiling grid.

FIG. 3 illustrates a mounting of a flat panel radiator in standard inverted "T" ceiling grid. In the current art, a flat panel radiator is mounted in a frame to allow its installation in a standard inverted "T" ceiling grid. FIG. 3 shows a section of a ceiling grid, including inverted tee main beams 600, supporting hanger wires 601, and cross tee beams 602. The radiator panel frame element 603 with an attached bridge support element 604 and an enclosure 606 is placed into the grid elements as shown by the dotted lines 605. The enclosure 606 contains a terminal block (not shown) for connecting the transducer to an external-driving source.

Figure 4:
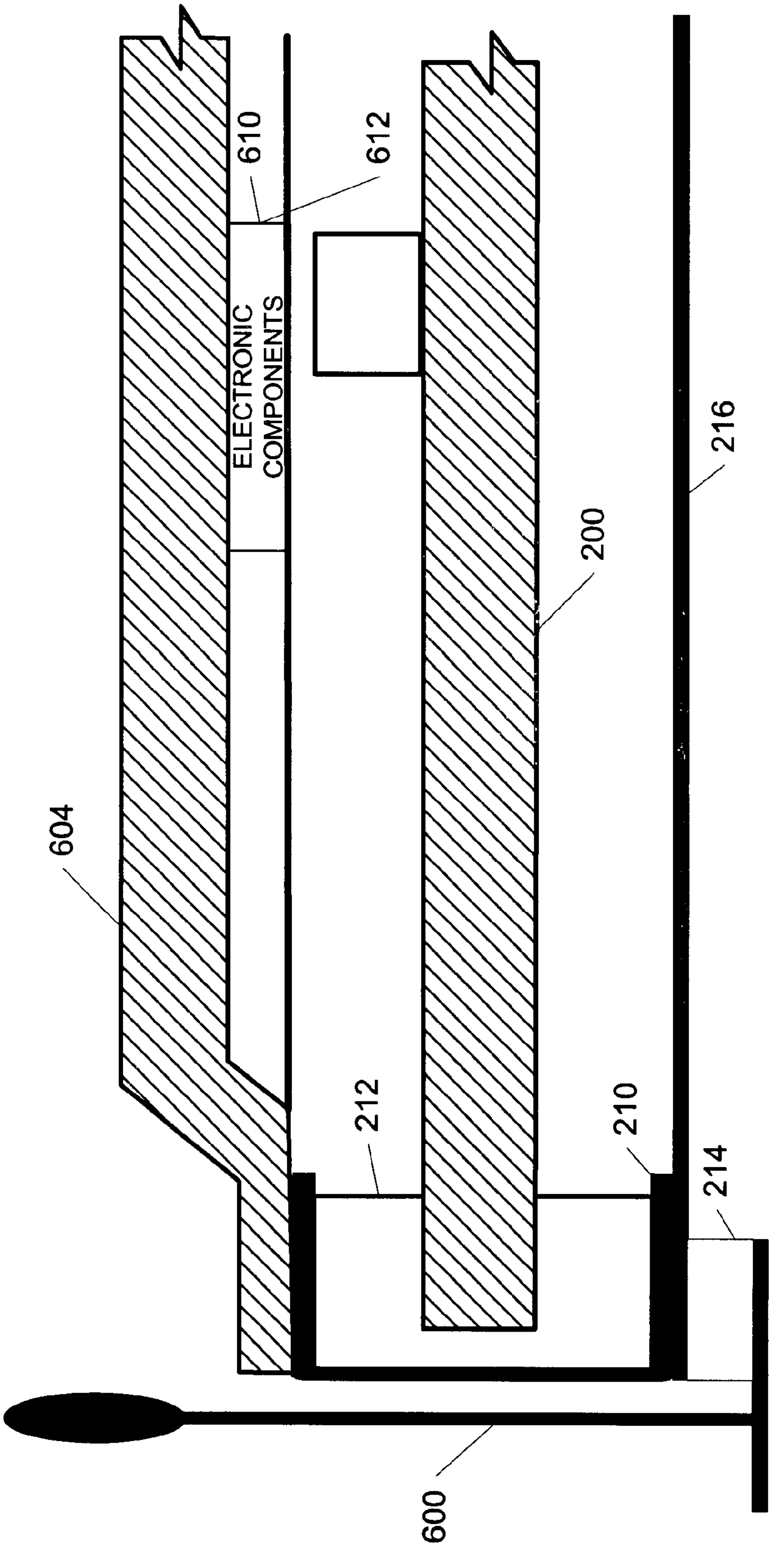
FIG. 4 illustrates an embodiment of a "C"-shaped frame with a containment element for a flat panel radiator.

FIG. 4 illustrates an embodiment of a C-shaped frame in which a flat panel radiator is mounted in a containment element positioned within the C-shaped frame. The flat panel radiator 200 is supported by C-shaped containment element 212, and placed inside a C-shaped frame 210. A bridge support element 604 is positioned above and across the frame 210. The bridge support element supports box 610 containing electronic components, which cause vibration of flat panel radiator 200 through driver 612. The frame 210 has an isolation element 214 attached to its bottom face that overlaps with the flanges of the ceiling grid system 600. The isolation element 214 can be made from a resilient material such as foam. The isolation element 214 isolates the flat panel radiator from the grid support elements 600 both mechanically and acoustically and prevents vibrations from the flat panel radiator onto the suspended ceiling system. A facing (scrim) 216 can be added as an acoustically transparent decorative cover for the flat panel radiator, and can be fabricated to aesthetically match the rest of the ceiling.

The C-shaped frame design with the containment element depicted in FIG. 4 affects the boundary condition at the perimeter of the radiator panel, and by choice of material stiffness can make the boundary either "simply supported" in which case it is free to bend all the way to the edge of the panel, or "clamped" in which case the panel must be straight at the edge. By variation of the material stiffness, boundary conditions between the simple support and the clamp can be obtained. The selection affects the modal frequencies thus affecting the operating frequency range of the system. In essence, the flat panel radiator is made tunable. If the choice of containment element 212 is fairly rigid material, then the isolation element 214 may be necessary to keep vibration from getting into the grid 600. If the containment element 212 is very soft, then the isolation can be accomplished with the containment, and the separate isolation element 214 may not be needed.

Figure 5:
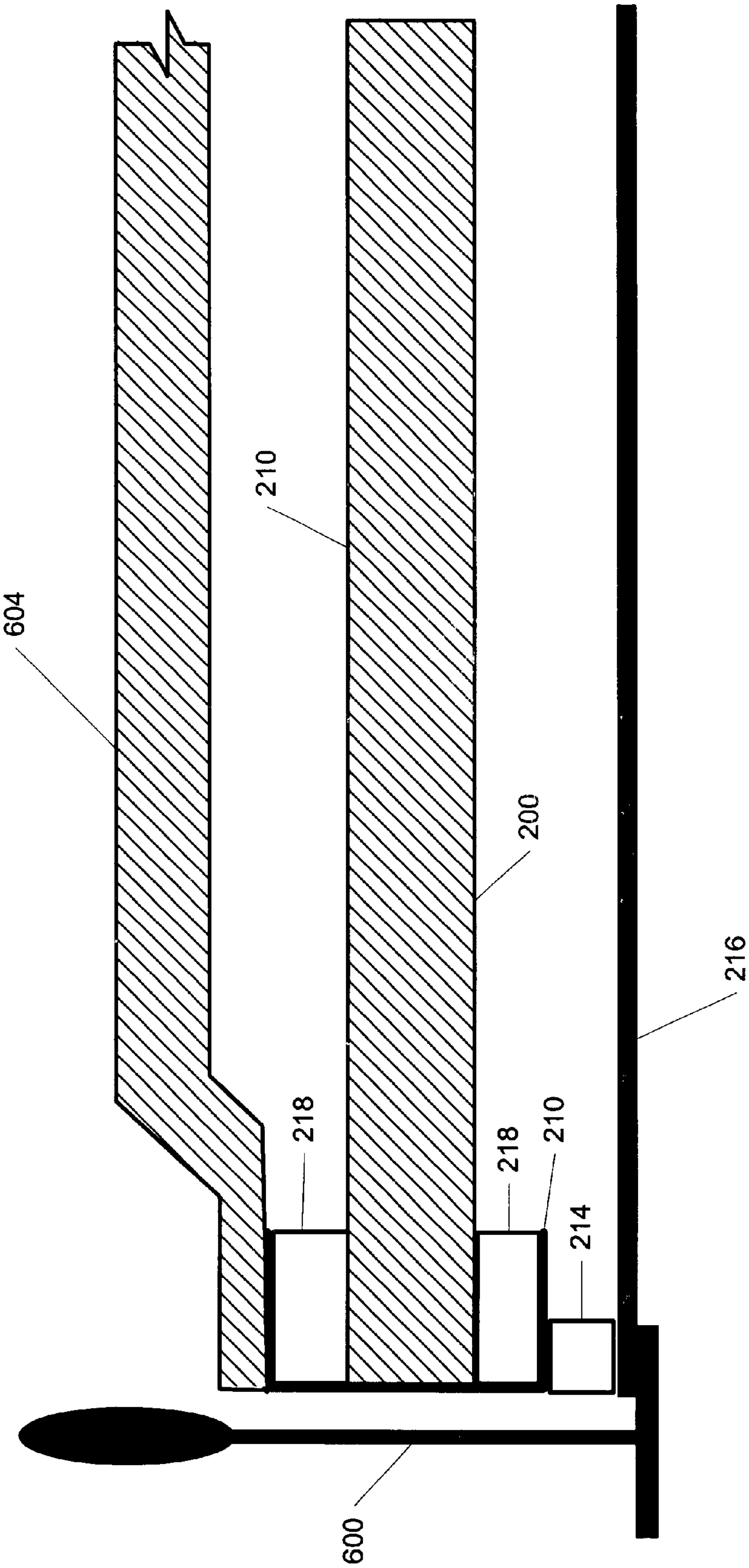
FIG. 5 illustrates an alternate embodiment of a "C"-shaped frame with a containment element for a flat panel radiator.

FIG. 5 illustrates that the containment element does not need to be "C"-shaped. The containment element 218 can be positioned at the top and bottom of the flat panel radiator 200. The containment element 218 does not need to be continuous along any edge of the flat panel radiator. Furthermore, the containment element 218 can be used on two edges of the flat panel radiator 200 instead of four.

Figure 6A:
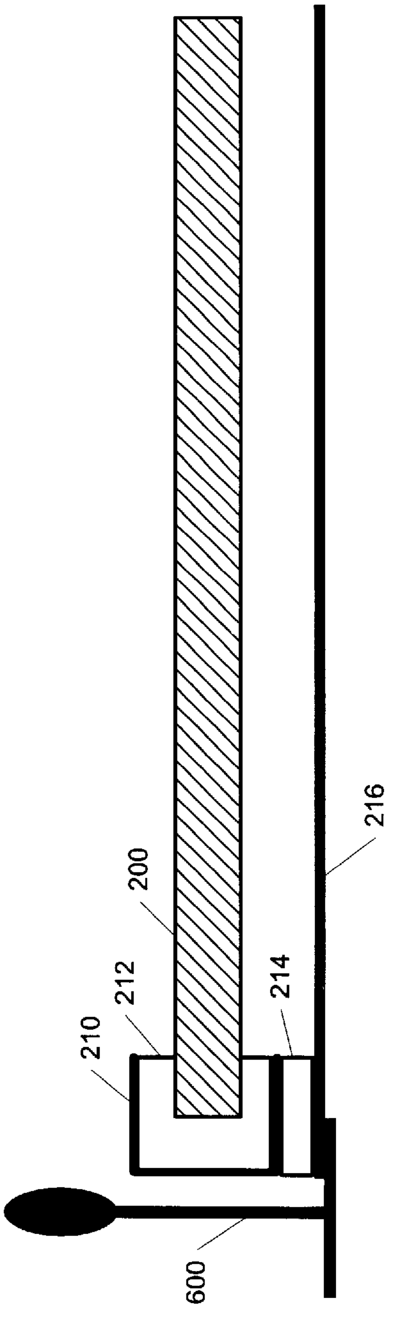
FIGS. 6A–6B illustrate alternate locations for the attachment of a facing element to an isolation element for a "C"-shaped frame.
Figure 6B:
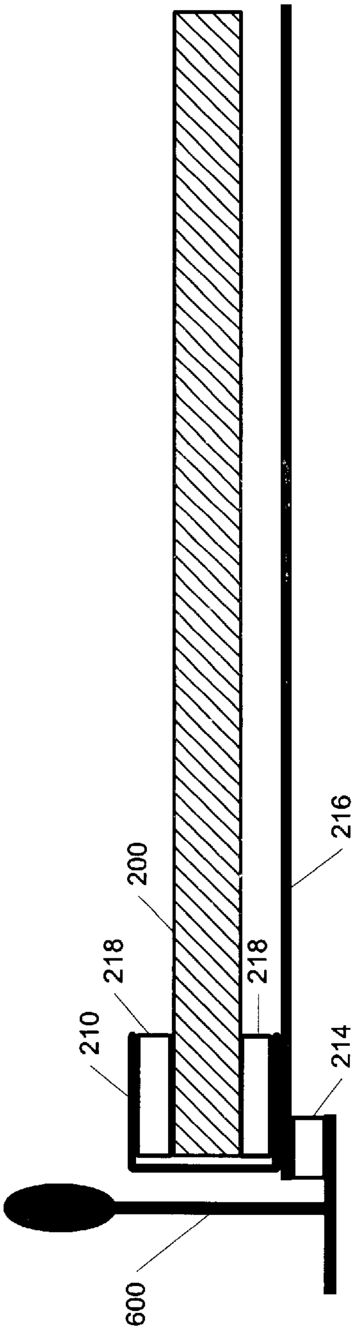

FIGS. 6A–6B illustrate alternate locations of the facing element for a C-shaped frame. In FIG. 6A, the facing is attached below the isolation element 214 and above the flange of ceiling grid 600. In FIG. 6B, the facing 216 is attached above the isolation element 214 and below the C-shaped frame.

Figure 7:
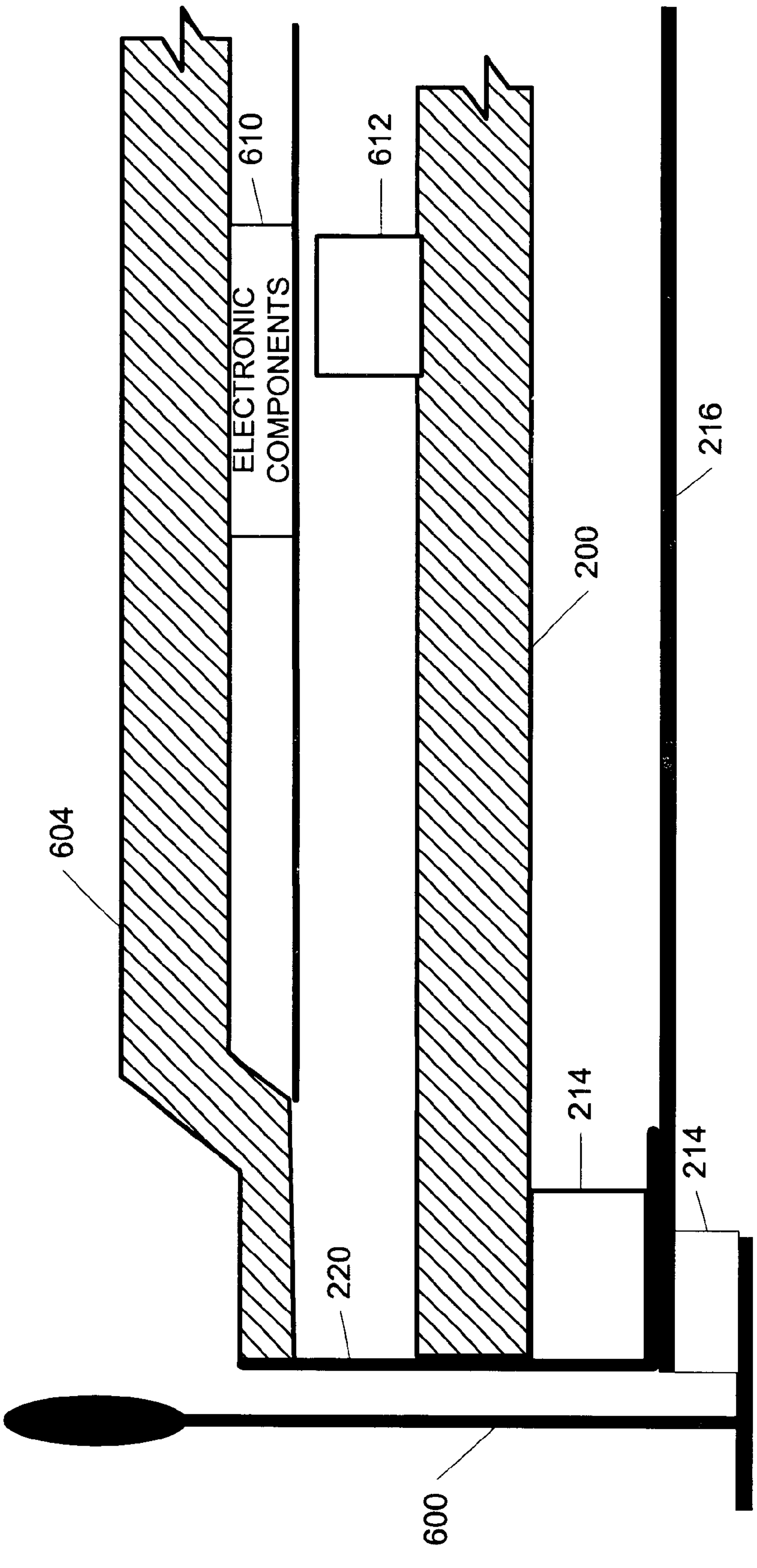
FIG. 7 illustrates an embodiment of a "L"-shaped frame with an isolation element.

FIG. 7 illustrates an embodiment of an L-shaped frame as opposed to a C-shaped frame. In this case, the edge of the flat panel radiator 200 cannot be clamped, and the isolation element 214 both holds the flat panel radiator 200 in place with an adhesive material, and isolates the flat panel radiator mechanically and acoustically from the ceiling grid structure 600. If the upper isolation element 214 is chosen to be sufficiently resilient, then the lower isolation element 214 may not be necessary. Conversely, if the upper isolation element 214 is minimized to the point of being essentially an adhesive application, then the lower isolation element 214 will be necessary.

Figure 8A:
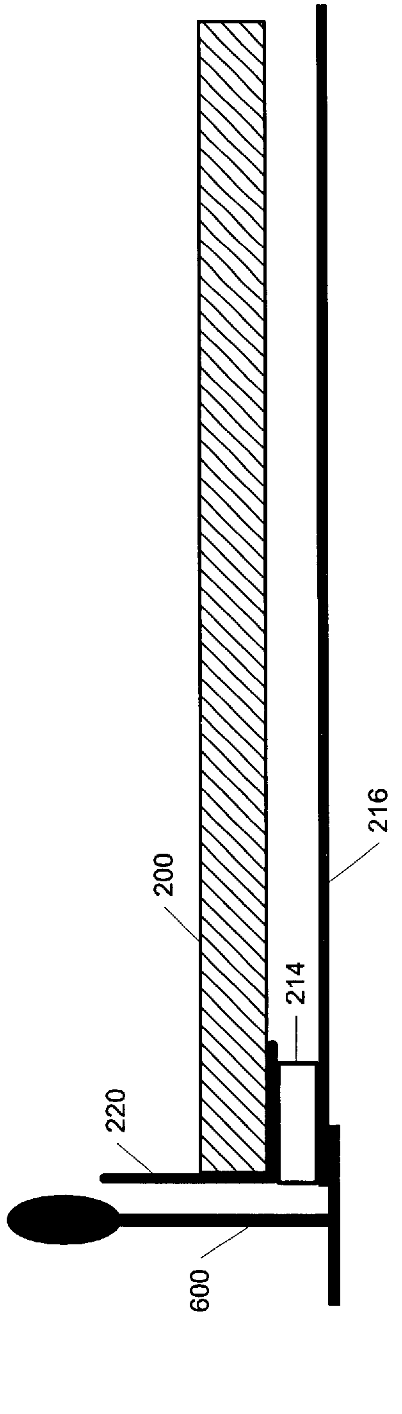
FIGS. 8A–8B illustrate different placement of the isolator and facing elements for an "L"-shaped frame of the present invention.
Figure 8B:
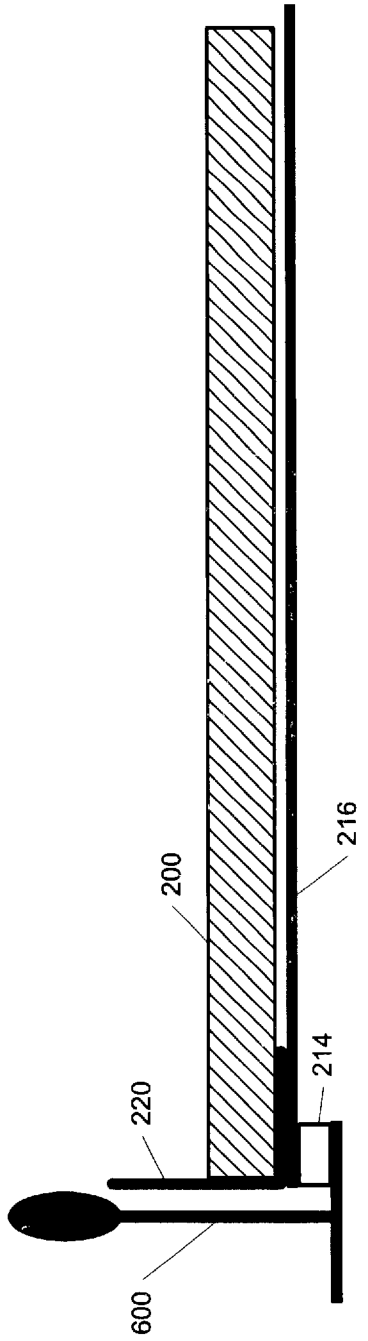

FIGS. 8A–8B illustrate different placements of the isolation element 214 and the facing element 216 for an L-shaped frame. FIG. 8A illustrates the edge of the flat panel radiator 200 attached by adhesive to the L-shaped frame. The isolation element 214 is attached to the lower surface of the L-shaped frame. The facing 216 is attached to the lower surface of the isolation element 214 which is positioned between the lower surface of the L-shaped frame 220 and the flange of the ceiling grid 600. In FIG. 8B, the edge of the flat panel radiator 200 is again attached by adhesive to the L-shaped frame 220. The facing element 216 is attached to the upper surface of the isolation element 214. The isolation element again is positioned between the lower surface of the L-shaped frame 220 and the flange of the ceiling grid 600.

Figure 9A:
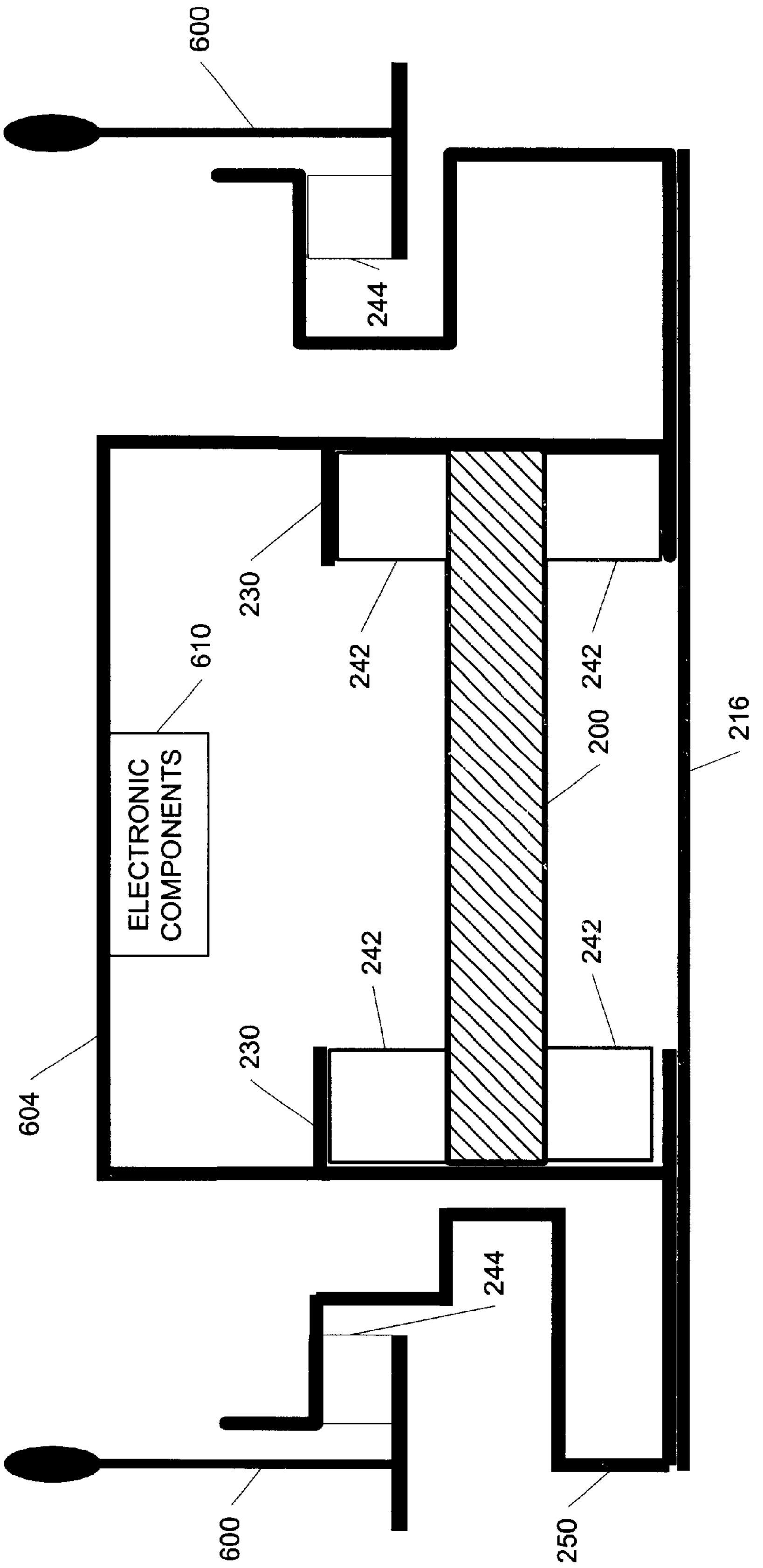
FIGS. 9A–9B illustrate embodiments of a vector-shaped frame for a flat panel radiator.
Figure 9B:
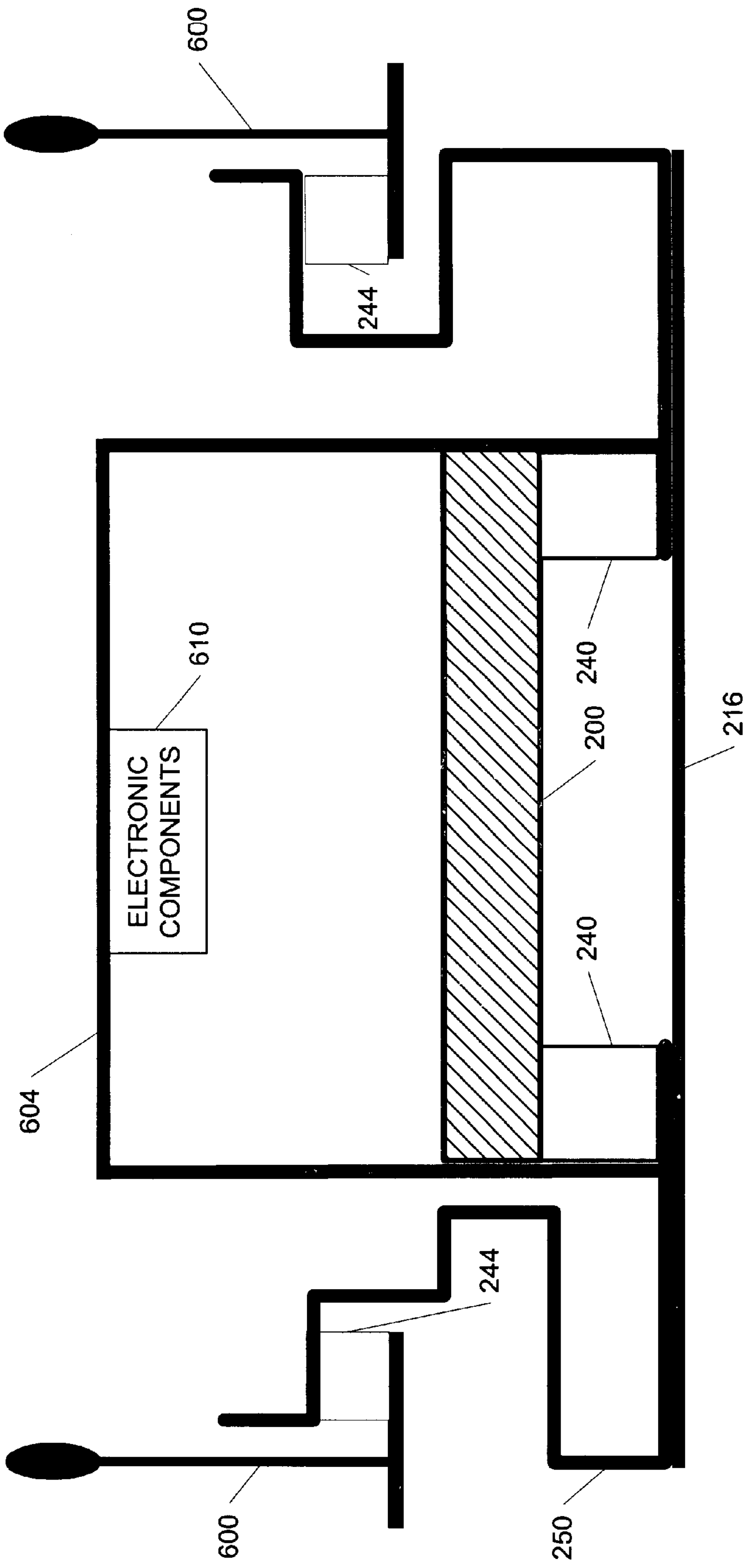

FIGS. 9A–9B illustrate two embodiments in which the flat panel radiator 200 is positioned in a vector-shaped frame for use in a vector ceiling panel system. The flat panel radiator 200 is positioned on its edges within a vector frame 250 having a C-shaped portion 230 in FIG. 9A or within a vector frame 250 having an L-shaped portion as depicted in FIG. 9B. In FIG. 9A, the functionality of the containment element(s) 242 within the C-shape, and the isolation element 244 on the frame 250, is identical to that described in FIGS. 4 and 5 for the lay-in panel designs. In FIG. 9B, the functionality of the isolation elements 240 and 244 are identical to that described in FIG. 7 for the lay-in panel design. Isolation elements 240, 242, 244 isolate the flat panel radiator mechanicall and acoustically from the vector frame 250 in each embodiment. The facing element 216 is attached to the lower surface of the vector frame 250. The optional isolation elements 244 can be affixed to the ceiling grid structure 600 and vector panel to provide further isolation for the vector frame 250. A bridge support element 604 is positioned above and across the top edges of vector frame 250. The bridge support element 604 supports electronics components box 610.

Although the present invention has been described in the context of a ceiling grid system, the sound radiator and assembly system can also be used in a grid structure of a wall partition having discrete panels similar to those used for the ceiling grid. In particular, the flat panel radiator would be supported in the same way but with the radiator positioned vertically, rather than horizontally between the upper and lower plates of the frame element. In addition, the acoustic scrim can be affixed to edges of the frame element facing into the listening area to again cover the opening created by the main beams and crossbeams of a wall partition. The scrim would be acoustically transparent.

The corresponding structures, materials, acts, and equivalents of any means plus function elements in any claims below are intended to include any structure, material, or acts for performing the functions in combination with other claimed elements as specifically claimed.

While the invention has been particularly shown and described with reference to embodiments thereof, it will be understood by those skilled in the art that various changes in form and detail may be made without departing from the spirit and scope of the present invention.

What is claimed is:

1. A flat panel radiator apparatus for use in a ceiling grid that includes a plurality of main beams and a plurality of crossbeams with the crossbeams supported by the main beams to define an opening for mounting a flat panel radiator, the apparatus comprising:

a frame having a side plate and a lower plate to form a cross-section having a generally L-shaped portion, the frame supporting the flat panel radiator, the frame disposed on at least two beams;

an isolation element interposed between the flat panel radiator and the ceiling grid to isolate the flat panel radiator from the beams of the ceiling grid; and a substantially acoustically transparent facing disposed below the flat panel radiator and extending across the opening defined by the plurality of main beams and crossbeams.

2. The flat panel radiator apparatus of claim 1 wherein the isolation element is affixed to the lower plate.

3. The flat panel radiator apparatus of claim 2 wherein the isolation element is affixed to the lower surface of the lower plate.

4. The flat panel radiator apparatus of claim 1 further comprising a containment element affixed to the upper surface of the lower plate to position the flat panel radiator within the frame.

5. The flat panel radiator apparatus of claim 1 further comprising a bridge supporting element attached to the frame and providing a mounting surface for electronic components.

6. The flat panel radiator apparatus of claim 5 further comprising electrical components disposed inside a terminal box mounted on the bridge supporting element.

7. The flat panel radiator apparatus of claim 6 wherein the terminal box is mounted on the lower surface of the bridge supporting element.

8. The flat panel radiator apparatus of claim 1 wherein the facing is secured to the lower surface of the lower plate and extends across the opening defined by the plurality of main beams and crossbeams.

9. The flat panel radiator apparatus of claim 1 wherein the facing is secured to the lower surface of the isolation element and extends across the opening defined by the plurality of main beams and crossbeams.

10. The flat panel radiator apparatus of claim 1 wherein the facing is secured to the upper surface of the isolation element and extends across the opening defined by the plurality of main beams and crossbeams.

11. The flat panel radiator apparatus of claim 4 wherein the frame further comprises an upper plate affixed to the side plate whereby the upper plate, side plate and lower plate form a cross-section having a generally C-shaped portion for supporting the flat panel radiator, and the apparatus comprises a second containment element affixed to the lower surface of the upper plate whereby the containment elements position the flat panel radiator within the frame.

12. The flat panel radiator apparatus of claim 4 wherein the frame further comprises an upper plate affixed to the side plate whereby the upper plate, side plate and lower plate form a cross-section having a generally C-shaped portion for supporting the flat panel radiator, and the containment element is contiguous to all three surfaces and is affixed to the upper surface of the lower plate and lower surface of the upper plate whereby the containment element positions the flat panel radiator within the frame.

13. The flat panel radiator apparatus of claim 4 wherein the containment element comprises a resilient material.

14. The flat panel radiator apparatus of claim 1 wherein the isolation element comprises a resilient material.

15. The flat panel radiator apparatus of claim 2 wherein the isolation element is affixed by an adhesive material to the lower plate of the frame.

16. The flat panel radiator apparatus of claim 1 wherein the isolation element isolates the flat panel radiator both mechanically and acoustically from the ceiling grid.

17. The flat panel radiator apparatus of claim 1 wherein the isolation element affixes the flat panel radiator to the frame.

18. The flat panel radiator apparatus of claim 1 wherein the frame has a vector edge profile.

19. The flat panel radiator apparatus of claim 1 wherein the isolation element is interposed between the frame and the ceiling grid to both mechanically and acoustically isolate the frame from the ceiling grid.

20. A radiator panel apparatus for use in a grid structure that includes a plurality of beams for mounting the radiator panel, the apparatus comprising:

a frame having a first plate, a second plate and a third plate to form a cross-section having a generally C-shaped portion for supporting the radiator panel, wherein the second plate is rigidly fixed between the first and third plates; and an isolation element interposed between the radiator panel and the ceiling grid to isolate the radiator panel from the beams of the grid structure.

21. The radiator panel apparatus of claim 20 further comprising a containment element affixed to the inner surface of the frame to position the radiator panel within the frame.

22. The radiator panel apparatus of claim 21 further comprising a second containment element, the first containment element being affixed to the inner surface of the first plate and the second containment element being affixed to the inner surface of the third plate to position the radiator panel within the frame.

23. The radiator panel apparatus of claim 20 wherein the isolation element is affixed to the outer surface of the frame.

24. The radiator panel apparatus of claim 20 wherein the grid structure is contained in a fixed wall or a moveable wall partition.

25. A flat panel radiator apparatus for use in a ceiling grid that includes a plurality of main beams and a plurality of crossbeams with the crossbeams supported by the main beams to define an opening for mounting a flat panel radiator, the apparatus comprising:

a frame having a side plate and a lower plate to form a cross-section having a generally L-shaped portion, the frame supporting the flat panel radiator, the frame disposed on at least two beams; and an isolation element interposed between the flat panel radiator and the beams of the ceiling grid to isolate the flat panel radiator from the beams of the ceiling grid.

26. The flat panel radiator apparatus of claim 25 wherein the isolation element is affixed to the lower plate.

27. The flat panel radiator apparatus of claim 26 wherein the isolation element is affixed to the lower surface of the lower plate.

28. The flat panel radiator apparatus of claim 25 further comprising a containment element affixed to the upper surface of the lower plate to position the flat panel radiator within the frame.

29. The flat panel radiator apparatus of claim 28 wherein the frame further comprises an upper plate affixed to the side plate whereby the upper plate, side plate and lower plate form a cross-section having a generally C-shaped portion for supporting the flat panel radiator, and the apparatus comprises a second containment element affixed to the lower surface of the upper plate whereby the containment elements position the flat panel radiator within the frame.

30. The flat panel radiator apparatus of claim 28 wherein the frame further comprises an upper plate affixed to the side plate whereby the upper plate, side plate and lower plate form a cross-section having a generally C-shaped portion for supporting the flat panel radiator, and the containment element is contiguous to all three surfaces and is affixed to the upper surface of the lower plate and lower surface of the upper plate whereby the containment element positions the flat panel radiator within the frame.

31. The flat panel radiator apparatus of claim 25 wherein the isolation element isolates the flat panel radiator both mechanically and acoustically from the ceiling grid.

* * * * *